(12) United States Patent
Ku et al.

(10) Patent No.: US 9,450,587 B2
(45) Date of Patent: Sep. 20, 2016

(54) TEST CIRCUIT AND TEST METHOD OF SEMICONDUCTOR APPARATUS

(71) Applicant: SK hynix Inc., Icheon-si Gyeonggi-do (KR)

(72) Inventors: Kie Bong Ku, Icheon-si (KR); Byung Kuk Yoon, Icheon-si (KR)

(73) Assignee: SK hynix Inc., Icheon-si, Gyeonggi-do (KR)

( * ) Notice: Subject to any disclaimer, the term of this patent is extended or adjusted under 35 U.S.C. 154(b) by 162 days.

(21) Appl. No.: 14/564,296

(22) Filed: Dec. 9, 2014

(65) Prior Publication Data

US 2016/0043726 A1 Feb. 11, 2016

(30) Foreign Application Priority Data

Aug. 8, 2014 (KR) .................. 10-2014-0102176

(51) Int. Cl.
| | |
|---|---|
| *G01R 31/30* | (2006.01) |
| *H03K 21/08* | (2006.01) |
| *G11C 29/02* | (2006.01) |
| *G11C 29/12* | (2006.01) |
| *G11C 29/50* | (2006.01) |

(52) U.S. Cl.
CPC .............. *H03K 21/08* (2013.01); *G01R 31/30* (2013.01); *G11C 29/021* (2013.01); *G11C 29/12015* (2013.01); *G11C 29/50* (2013.01); *G11C 29/50012* (2013.01)

(58) Field of Classification Search
CPC ................ G01R 31/30; G11C 29/021; G11C 29/12015; G11C 29/50; G11C 29/50012
See application file for complete search history.

(56) References Cited

U.S. PATENT DOCUMENTS

| | | | | |
|---|---|---|---|---|
| 8,497,694 | B2 * | 7/2013 | Chua-Eoan | G01R 29/26 324/750.15 |
| 8,593,171 | B2 * | 11/2013 | Kosonocky | G01R 31/40 324/764.01 |
| 8,847,777 | B2 * | 9/2014 | Ramaswami | G01R 31/3004 324/103 R |
| 2010/0169045 | A1 * | 7/2010 | Shin | G01R 31/2882 702/179 |
| 2011/0074398 | A1 * | 3/2011 | Barton | G01R 19/0084 324/133 |

FOREIGN PATENT DOCUMENTS

KR 1020100078431 A 7/2010

* cited by examiner

*Primary Examiner* — Patrick O'Neill
(74) *Attorney, Agent, or Firm* — Willaim Park & Associates Ltd.

(57) ABSTRACT

A test circuit of a semiconductor apparatus may include a period signal counting block configured to count a period signal by a predetermined number of times, and enable an overflow signal. The test circuit of the semiconductor apparatus may include a clock signal counting block configured to count an internal clock signal until the overflow signal is enabled, and may output clock counting codes. The test circuit of the semiconductor apparatus may include an update register configured to receive and store the clock counting codes based on the overflow signal.

20 Claims, 7 Drawing Sheets

TEST CIRCUIT AND TEST METHOD OF SEMICONDUCTOR APPARATUS

CROSS-REFERENCES TO RELATED APPLICATION

The present application claims priority under 35 U.S.C. §119(a) to Korean application number 10-2014-0102176, filed on Aug. 8, 2014, in the Korean Intellectual Property Office, which is incorporated herein by reference in its entirety.

BACKGROUND

1. Technical Field

Various embodiments generally relate to a semiconductor apparatus, and more particularly, to a test circuit and a test method of a semiconductor apparatus.

2. Related Art

A semiconductor apparatus may operate by receiving a power supply voltage from outside the semiconductor apparatus. The recent developmental trends of a semiconductor apparatus includes high integration, is directed to high speed operations and low power consumption. However, high integration and high speed operation developments have a trade-off relationship with low power consumption developments. In the case where a semiconductor apparatus operating at a high speed uses a power supply voltage with a low level, it is difficult to secure the precision of signals to be transmitted and received inside the semiconductor apparatus or between the semiconductor apparatus and a controller. Therefore, it may be difficult to ensure the operational reliability of the semiconductor apparatus. Hence, in order to secure the constant performance of a semiconductor apparatus, it may be important to constantly retain the level of a power supply voltage to be used in the semiconductor apparatus and monitor a variation in the level of the power supply voltage according to an operation of the semiconductor apparatus.

A semiconductor apparatus is generally manufactured on a wafer. Various tests may be performed before the semiconductor apparatus is packaged and is placed on the market as a product. Because a large number of different kinds of tests are included according to the operation modes and stress circumstances of the semiconductor apparatus, it may be difficult to separately perform a test in such a way for monitoring a variation in the level of a power supply voltage according to operational states of the semiconductor apparatus.

SUMMARY

In an embodiment, a test circuit of a semiconductor apparatus may include a period signal counting block configured to count a period signal by a predetermined number of times, and enable an overflow signal. The test circuit of a semiconductor apparatus may include a clock signal counting block configured to count an internal clock signal until the overflow signal is enabled. The test circuit of a semiconductor apparatus may include output clock counting codes, and an update register configured to receive and store the clock counting codes based on the overflow signal.

In an embodiment, a test method of a semiconductor apparatus may include toggling a period signal a predetermined number of times in each predetermined period when a test operation is started. The test method of a semiconductor apparatus may include counting an internal clock signal for a time during which the period signal is toggled by the predetermined number of times, and generating clock counting codes. The test method of a semiconductor apparatus may include updating the clock counting codes in each predetermined period, and outputting updated clock counting codes when the test operation is ended.

DETAILED DESCRIPTION

Hereinafter, a test circuit and a test method of a semiconductor apparatus will be described below with reference to the accompanying drawings through various examples of embodiments.

Various embodiments may be directed to a test circuit of a semiconductor apparatus. The test circuits may monitor the characteristic of a semiconductor apparatus through counting the time for a period signal to toggle by a predetermined number of times, by a clock signal.

Figure 1:
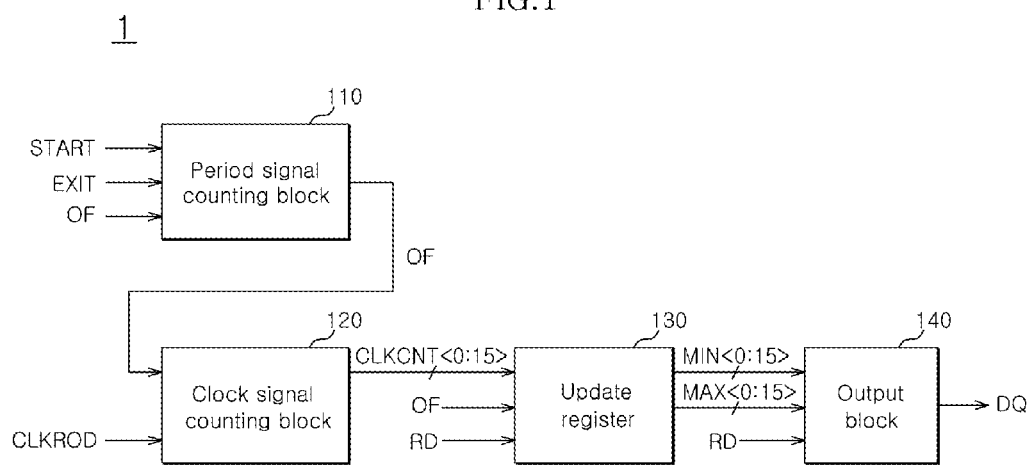
FIG. 1 is a block diagram illustrating a representation of an example of the configuration of a test circuit of a semiconductor apparatus in accordance with an embodiment.

In FIG. 1, a test circuit 1 of a semiconductor apparatus in accordance with an embodiment may include a period signal counting block 110, a clock signal counting block 120, and an update register 130. The period signal counting block 110 and the clock signal counting block 120 may be activated in a test operation of the semiconductor apparatus and may be deactivated while not in the test operation. The period signal counting block 110 may count a period signal by a predetermined number of times in each predetermined period in the test operation, and may generate an overflow signal OF. The overflow signal OF may be generated each time the period signal is counted by the predetermined number of times. The period signal counting block 110 may repeatedly perform the operation of counting the period signal in respective predetermined periods, and the overflow signal OF may be enabled in each of the predetermined periods. The predetermined period may be randomly set, and the predetermined number of times may also be randomly set. For example, the predetermined number of times may be, but not limited to, 1280. The period signal as a signal oscillating with a preselected cycle may be generated through a ring oscillator. The ring oscillator will be described later.

The clock signal counting block 120 may count an internal clock signal CLKROD and generate clock counting codes CLKCNT<0:15>. The clock signal counting block 120 may count the number of times the internal clock signal CLKROD toggles, and may generate the clock counting codes CLKCNT<0:15> having a plurality of bits. While the clock counting codes CLKCNT<0:15> are illustrated as having 16 bits, it is to be noted that the embodiments are not limited to such an example. The counting operation of the clock signal counting block 120 may be controlled based on the overflow signal OF. The clock signal counting block 120 may perform the counting operation in the test operation of the semiconductor apparatus, and may be reset based on the overflow signal OF. After being reset, the clock signal counting block 120 may repeatedly perform the operation of counting the internal clock signal CLKROD until the test operation is ended. Since the clock signal counting block 120 may be reset based on the overflow signal OF, the clock signal counting block 120 may output a result of counting the internal clock signal CLKROD for a time during which the period signal toggles by the predetermined number of times, as the clock counting codes CLKCNT<0:15>. The clock signal counting block 120 may generate and output the clock counting codes CLKCNT<0:15> in each predetermined period.

The update register 130 may receive the clock counting codes CLKCNT<0:15> from the clock signal generation block 120. The update register 130 may store the received clock counting codes CLKCNT<0:15>. The update register 130 may include a register for storing the clock counting codes CLKCNT<0:15>. As described above, since the clock signal counting block 120 may newly generate the clock counting codes CLKCNT<0:15> in each predetermined period, the update register 130 may perform an update operation by comparing the clock counting codes CLKCNT<0:15> stored therein and the clock counting codes CLKCNT<0:15> currently outputted from the clock signal counting block 120. The update register 130 may compare the stored clock counting codes CLKCNT<0:15> and the currently received clock counting codes CLKCNT<0:15>, based on the overflow signal OF. The update register 130 may output the clock counting codes CLKCNT<0:15> stored therein, in response to a read signal RD. The update register 130 may output minimum code values MIN<0:15> and maximum code values MAX<0:15> by performing the operation of comparing the clock counting codes CLKCNT<0:15>. Descriptions for the update register 130 will be made later.

The semiconductor apparatus may perform the test operation in response to a test start signal START. The semiconductor apparatus may end the test operation that is being performed, in response to a test exit signal EXIT. The period signal counting block 110 may receive the test start signal START and the test exit signal EXIT, and may be activated in response to the respective signals. The internal clock signal CLKROD may be provided to the clock signal counting block 120 in response to the test start signal START. The internal clock signal CLKROD may be blocked from being provided to the clock signal counting block 120, in response to the test exit signal EXIT. For example, the internal clock signal CLKROD may be provided to the clock signal counting block 120 during only the test operation of the semiconductor apparatus. While the test start signal START and the test exit signal EXIT are described as separate signals in the embodiments, it is to be noted that these signals may be realized as one signal. For example, the test circuit 1 of a semiconductor apparatus may use a test enable signal instead of the test start signal START and the test exit signal EXIT, and may perform the test operation when the test enable signal is enabled and end the test operation when the test enable signal is disabled.

The test circuit 1 of a semiconductor apparatus may further include an output block 140. The output block 140 may output the clock counting codes CLKCNT<0:15> stored in the update register 130, as data DQ. The output block 140 may receive the minimum code values MIN<0:15> and the maximum code values MAX<0:15> from the update register 130. The output block 140 may output ones of the minimum code values MIN<0:15> and the maximum code values MAX<0:15>, as the data DQ, in response to the read signal RD. Although the output block 140 may be, for example, a component separately provided from the test circuit 1, an internal circuit disposed in the semiconductor apparatus may be used. The output block 140 may output the clock counting codes CLKCNT<0:15> to an exterior of the semiconductor apparatus, by using paths and/or circuits through which the data of the semiconductor apparatus are outputted.

Figure 2:
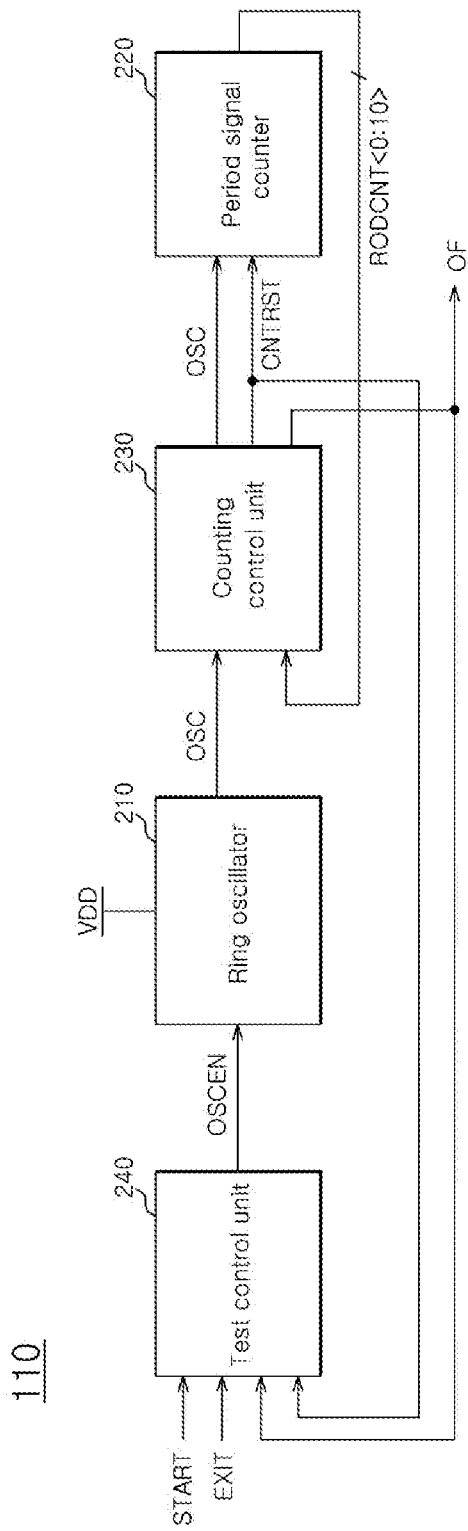
FIG. 2 is a block diagram illustrating a representation of an example of the configuration of the period signal counting block illustrated in FIG. 1.

FIG. 2 is a block diagram illustrating a representation of an example of the configuration of the period signal counting block 110 illustrated in FIG. 1. Referring to FIG. 2, the period signal counting block 110 may include a ring oscillator 210, a period signal counter 220, and a counting control unit 230. The ring oscillator 210 may generate a period signal OSC in response to an oscillating enable signal OSCEN. The ring oscillator 210 may receive a power supply voltage VDD. The ring oscillator 210 may generate the period signal OSC. The period signal may swing from the level of the power supply voltage VDD to a ground voltage. The power supply voltage VDD may be any one of internal power sources used by the semiconductor apparatus. In an embodiment, by replacing the power supply voltage VDD with other internal power sources, it is possible to generate the period signal OSC which toggles to the levels of various internal power sources. Therefore, the operational characteristics of the semiconductor apparatus may be monitored in a variety of ways under circumstances using various internal power sources.

The period signal counter 220 may receive the period signal OSC from the ring oscillator 210 and count the number of toggling times of the period signal OSC. The period signal counter 220 may count the period signal OSC and generate period signal counting codes RODCNT<0:10>. The period signal counter 220 may be reset in response to a counting reset signal CNTRST. When being reset, the period signal counter 220 may initialize the period signal counting codes RODCNT<0:10>. While the period signal counting codes RODCNT<0:10> are illustrated as having 11 bits, it is to be noted that the embodiments are not limited to such an example.

The counting control unit 230 may control the providing of the period signal OSC generated by the ring oscillator 210, to the period signal counter 220. The counting control unit 230 may receive the period signal counting codes RODCNT<0:10> and generate the overflow signal OF. The counting control unit 230 may enable the overflow signal OF when the period signal counting codes RODCNT<0:10> have specific logic values. For example, when the period signal OSC is counted 1280 times and the period signal counting codes RODCNT<0:10> have logic values corresponding to 1280, the overflow signal OF may be enabled. If the overflow signal OF is enabled, the counting control unit 230 may block the period signal OSC generated by the ring oscillator 210, from being inputted to the period signal counter 220.

The counting control unit 230 may generate the counting reset signal CNTRST based on the overflow signal OF. The counting reset signal CNTRST may be enabled after a predetermined time passes from when the overflow signal OF is enabled. For example, the counting reset signal CNTRST may be generated as the overflow signal OF is delayed by the predetermined time. The counting reset signal CNTRST may be inputted to the period signal counter 220 and initialize the period signal counter 220. If the period signal counter 220 is reset, the period signal counting codes RODCNT<0:10> are initialized and do not have the specific logic values any more. Accordingly, the overflow signal OF is disabled, and the counting control unit 230 may provide again the period signal OSC to the period signal counter 220. Thus, the counting control unit 230 may repeatedly provide the period signal OSC to the period signal counter 220 with the predetermined period, and the period signal counter 220 may generate the period signal counting codes RODCNT<0:10> a multitude of times, based on the overflow signal OF and the counting reset signal CNTRST, during the test operation.

In FIG. 2, the period signal counting block 110 may further include a test control unit 240. The test control unit 240 may generate the oscillating enable signal OSCEN based on the test start signal START, the test exit signal EXIT and the overflow signal OF. The test control unit 240 may enable the oscillating enable signal OSCEN when the test start signal START is enabled. The test control unit 240 may disable the oscillating enable signal OSCEN when the test exit signal EXIT is enabled. The test control unit 240 may repeatedly disable and enable the oscillating enable signal OSCEN based on the overflow signal OF until the test exit signal EXIT is enabled. The test control unit 240 may disable the oscillating enable signal OSCEN in response to the overflow signal OF. The test control unit 240 may enable the oscillating enable signal OSCEN in response to the counting reset signal CNTRST.

Figure 3:
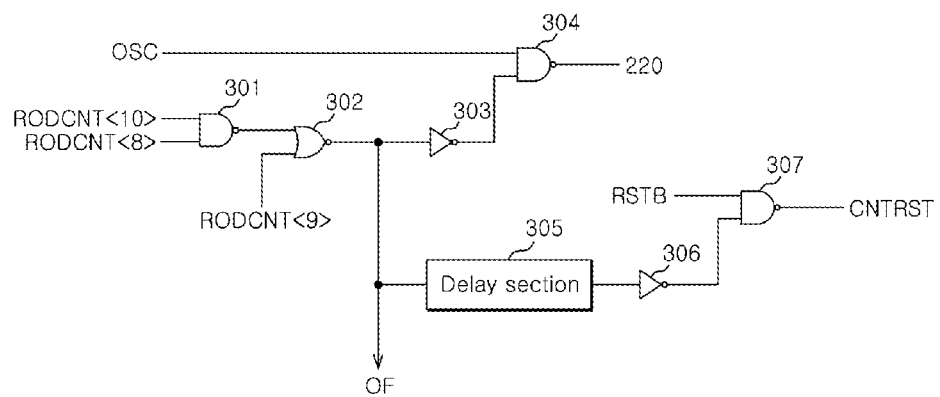
FIG. 3 is a circuit diagram illustrating a representation of an example of the configuration of the counting control unit illustrated in FIG. 2.

FIG. 3 is a circuit diagram illustrating a representation of an example of the configuration of the counting control unit 230 illustrated in FIG. 2. Referring to FIG. 3, the counting control unit 230 may include first to third NAND gates 301, 304 and 307. The counting control unit 230 may include a NOR gate 302, first and second inverters 303 and 306, and a delay section 305. The first NAND gate 301 may receive, for example, the eleventh bit RODCNT<10> of the period signal counting codes RODCNT<0:10>. The first NAND gate 301 may receive, for example, the ninth bit RODCNT<8> of the period signal counting codes RODCNT<0:10>. The NOR gate 302 may receive the output of the first NAND gate 301 and the tenth bit RODCNT<9> of the period signal counting codes RODCNT<0:10>. The NOR gate 302 may output the overflow signal OF. The ninth to eleventh bits RODCNT<8:10> of the period signal counting codes RODCNT<0:10> may respectively have information on whether the period signal counting codes RODCNT<0:10> have reached the specific logic values. If the specific logic values correspond to 1280 times, the ninth bit RODCNT<8> of the period signal counting codes RODCNT<0:10> may be 1, the tenth bit RODCNT<9> may be 0, and the eleventh bit RODCNT<10> may be 1. Accordingly, if the respective bits have the logic values of 1,0,1, it may be determined that the period signal counting codes RODCNT<0:10> have reached the specific logic values, and the first NAND gate 301 and the NOR gate 320 may enable the overflow signal OF to a high level. In the examples where the period signal counter 220 is reset by the counting reset signal CNTRST, the period signal counting codes RODCNT<0:10> are initialized, and the respective bits RODCNT<8:10> have logic values other than 1,0,1. Therefore, the first NAND gate 301 and the NOR gate 302 may disable the overflow signal OF to a low level. While it is described in an embodiment as an example that the overflow signal OF is generated when the period signal counter 220 counts the period signal OSC 1280 times, it is to be noted that the embodiments are not limited to such an example. The period signal counter 220 may be modified to generate the overflow signal OF when it counts another certain number of times, and the order of the bits of the period signal counting codes RODCNT<0:10> received by the first NAND gate 301 and the NOR gate 302 may be changed to determine whether specific logic values corresponding to another certain number of times have been reached. Also, according to the bits received to determine whether specific logic values have been reached, the logic circuit configured by the first NAND gate 301 and the NOR gate 302 may be freely redesigned.

The first inverter 303 inverts the overflow signal OF and outputs a resultant signal. The second NAND gate 304 receives the period signal OSC and the output of the first inverter 303. The second NAND gate 304 may allow the period signal OSC to be outputted to the period signal counter 220, when the output of the first inverter 303 is a high level. The second NAND gate 304 may block the period signal OSC from being outputted to the period signal counter 220, when the output of the first inverter 303 is a low level. In the example where the output of the first inverter 303 is at the low level, the output of the second NAND gate 304 is fixed to a high level, and the period signal counter 220 may not perform the counting operation. Therefore, the first inverter 303 and the second NAND gate 304 may not output the period signal OSC to the period signal counter 220 when the overflow signal OF is enabled, and may output the period signal OSC to the period signal counter 220 when the overflow signal OF is disabled.

The delay section 305 delays the overflow signal OF by the predetermined time. The second inverter 306 inverts the output of the delay section 305, and outputs a resultant signal. The third NAND gate 307 may output the counting reset signal CNTRST in response to the output of the second inverter 306 and a system reset signal RSTB. The third NAND gate 307 may enable the counting reset signal CNTRST to a high level when the system reset signal RSTB is enabled to a low level. Also, when the system reset signal RSTB is disabled to a high level, the third NAND gate 307 may enable the counting reset signal CNTRST to the high level when the overflow signal OF is enabled and thus the output of the second inverter 306 is a low level. The system reset signal RSTB may be a signal used as an initializing signal of the semiconductor apparatus. The clock signal counting block 120 (see FIG. 1) may include the logics 305, 306 and 307 of the counting control unit 230, which generate the counting reset signal CNTRST, in the same manner. Alternatively, the logics 305, 306 and 307 may be commonly used in the counting control unit 230 and the clock signal counting block 120.

Figure 4:
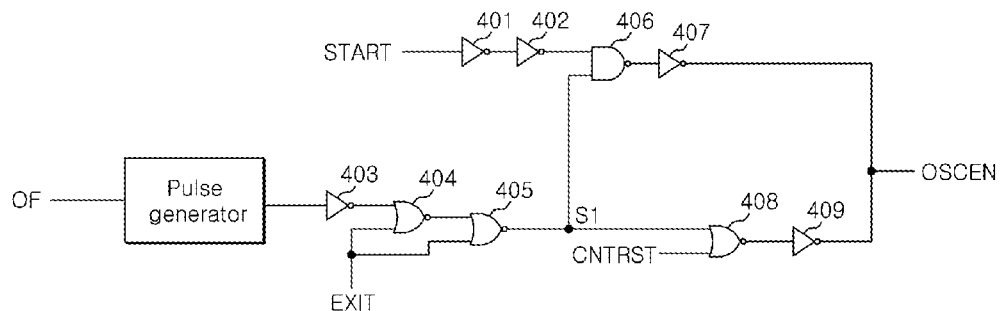
FIG. 4 is a circuit diagram illustrating a representation of an example of the configuration of the test control unit illustrated in FIG. 2.

FIG. 4 is a circuit diagram illustrating a representation of an example of the configuration of the test control unit 240 illustrated in FIG. 2. Referring to FIG. 4, the test control unit 240 may include a pulse generator, and first to fifth inverters 401, 402, 403, 407 and 409. The test control unit 240 may include a NAND gate 406, and first to third NOR gates 404, 405 and 408. The first inverter 401 inverts the test start signal START and outputs a resultant signal. The second inverter 402 inverts the output of the first inverter 401 and outputs a resultant signal.

The pulse generator generates a pulse signal having a predetermined pulse width, when the overflow signal OF is enabled. The third inverter 403 inverts the output of the pulse generator and outputs a resultant signal. The first NOR gate 404 receives the output of the third inverter 403 and the test exit signal EXIT. The second NOR gate 405 receives the output of the first NOR gate 404 and the test exit signal EXIT and outputs a first signal S1. When the test exit signal EXIT is disabled to a low level, the first signal S1 may be enabled to a high level if the overflow signal OF is disabled to the low level, and may be disabled to a low level when the overflow signal OF is enabled to the high level.

The NAND gate 406 may receive the output of the second inverter 402 and the first signal S1. The fourth inverter 407 may invert the output of the NAND gate 406 and generate the oscillating enable signal OSCEN. The NAND gate 406 and the fourth inverter 407 may receive the test start signal START enabled to a high level and the first signal S1 of the high level (since the test operation is started, the overflow signal OF is disabled to the low level), and enable the oscillating enable signal OSCEN. Thereafter, if the overflow signal OF is enabled and the first signal S1 is disabled to the low level, the NAND gate 406 and the fourth inverter 407 may disable the oscillating enable signal OSCEN.

The third NOR gate 408 receives the first signal S1 and the counting reset signal CNTRST. The fifth inverter 409 inverts the output of the third NOR gate 408, and generates the oscillating enable signal OSCEN. When the overflow signal OF is enabled to the high level, the third NOR gate 408 and the fifth inverter 409 generate the oscillating enable signal OSCEN disabled to a low level, since the first signal S1 is disabled to the low level. Thereafter, if the counting reset signal CNTRST is enabled to the high level after the predetermined time passes, the third NOR gate 408 and the fifth inverter 409 may enable the oscillating enable signal OSCEN. If the counting reset signal CNTRST is enabled, since the overflow signal OF is disabled, the first signal S1 may be enabled again to the high level, and the oscillating enable signal OSCEN may be enabled by the outputs of the NAND gate 406 and the fourth inverter 407.

Figure 5:
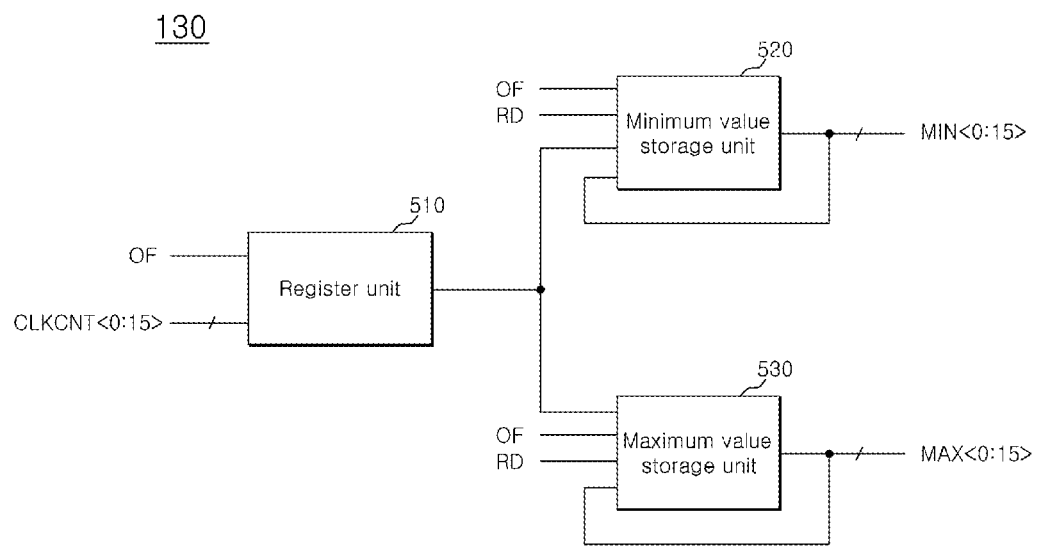
FIG. 5 is a block diagram illustrating a representation of an example of the configuration of the update register illustrated in FIG. 1.

FIG. 5 is a block diagram illustrating a representation of an example of the configuration of the update register 130 illustrated in FIG. 1. Referring to FIG. 5, the update register 130 may include a register unit 510, a minimum value storage unit 520, and a maximum value storage unit 530. The register unit 510 may receive the clock counting codes CLKCNT<0:15> outputted from the clock signal counting block 120 (see FIG. 1). The register unit 510 may store the received clock counting codes CLKCNT<0:15> based on the overflow signal OF. For example, the register unit 510 may store the clock counting codes CLKCNT<0:15> outputted from the clock signal counting block 120, when the overflow signal OF is enabled.

The minimum value storage unit 520 receives the clock counting codes CLKCNT<0:15> stored in the register unit 510. The minimum value storage unit 520 may output the received clock counting codes CLKCNT<0:15> as minimum code values MIN<0:15>. The minimum value storage unit 520 may compare the clock counting codes CLKCNT<0:15> currently received and clock counting codes CLKCNT<0:15> to be inputted next, and may update clock counting codes CLKCNT<0:15> with smaller logic values as the minimum code values MIN<0:15>. The minimum value storage unit 520 may perform the operation of comparing the logic values of the clock counting codes CLKCNT<0:15>, based on the overflow signal OF. Accordingly, each time the overflow signal OF is enabled, the minimum value storage unit 520 may compare the clock counting codes CLKCNT<0:15> inputted through the register unit 510 with previous clock counting codes CLKCNT<0:15>, and update the clock counting codes CLKCNT<0:15> having smaller logic values as the minimum code values MIN<0:15>. The minimum value storage unit 520 may output the minimum code values MIN<0:15> based on the read signal RD.

The maximum value storage unit 530 receives the clock counting codes CLKCNT<0:15> stored in the register unit 510. The maximum value storage unit 530 may output the received clock counting codes CLKCNT<0:15> as maximum code values MAX<0:15>. The maximum value storage unit 530 may compare the clock counting codes CLKCNT<0:15> currently received and clock counting codes CLKCNT<0:15> to be inputted next, and may update clock counting codes CLKCNT<0:15> with larger logic values as the maximum code values MAX<0:15>. The maximum value storage unit 530 may perform the operation of comparing the logic values of the clock counting codes CLKCNT<0:15>, based on the overflow signal OF. Accordingly, each time the overflow signal OF is enabled, the maximum value storage unit 530 may compare the clock counting codes CLKCNT<0:15> inputted through the register unit 510 with previous clock counting codes CLKCNT<0:15>, and update the clock counting codes CLKCNT<0:15> having larger logic values as the maximum code values MAX<0:15>. The maximum value storage unit 530 may output the maximum code values MAX<0:15> based on the read signal RD.

Figure 6:
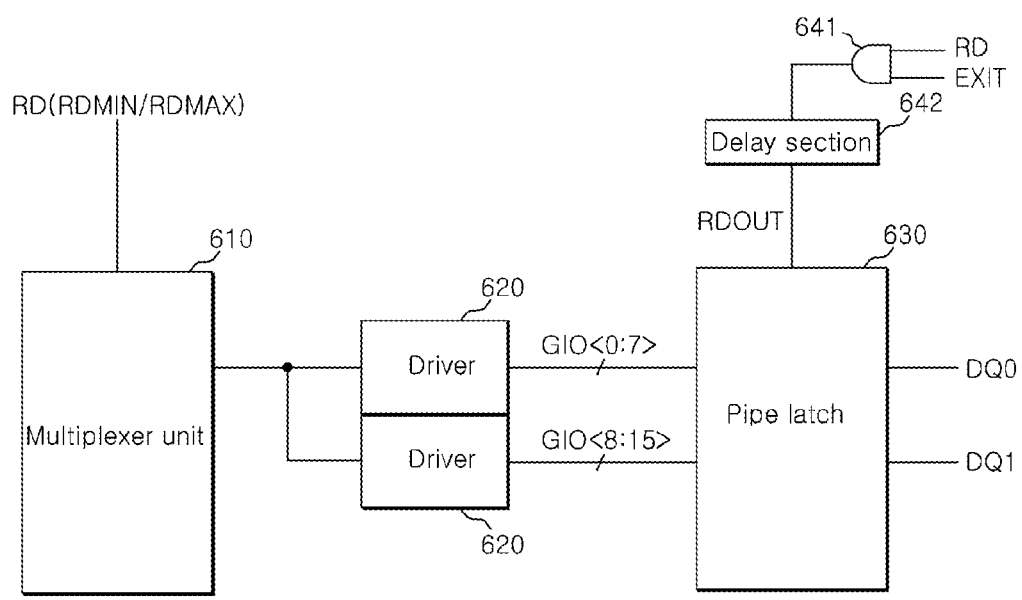
FIG. 6 is a block diagram illustrating a representation of an example of the configuration of the output block illustrated in FIG. 1.

FIG. 6 is a block diagram illustrating a representation of an example of the configuration of the output block 140 illustrated in FIG. 1. Referring to FIG. 6, the output block 140 may include a multiplexer unit 610, a plurality of drivers 620, and a pipe latch 630. The multiplexer unit 610 may receive the minimum code values MIN<0:15> and the maximum code values MAX<0:15> from the minimum value storage unit 520 and the maximum value storage unit 530. The multiplexer unit 610 may output multiple minimum code values MIN<0:15> and multiple maximum code values MAX<0:15> based on the read signal RD. In an embodiment, the read signal RD may be inputted a multitude of times. The multiplexer unit 610 may output the minimum code values MIN<0:15> in response to the read signal RD inputted first and may output the maximum code values MAX<0:15> in response to the read signal RD inputted second. Further, in an embodiment, the read signal RD may include a minimum value read signal RDMIN and a maximum value read signal RDMAX. The multiplexer unit 610 may output the minimum code values MIN<0:15> in response to the minimum value read signal RDMIN. The multiplexer unit 610 may output the maximum code values MAX<0:15> in response to the maximum value read signal RDMAX.

The plurality of drivers 620 may drive and output the clock counting codes CLKCNT<0:15> outputted from the multiplexer unit 610, that is, ones of the minimum code values MIN<0:15> and the maximum code values MAX<0:15>, to data transmission lines GIO<0:15> allocated thereto. For example, in the case where the clock counting codes CLKCNT<0:15> have 16 bits, the plurality of drivers 620 may output the respective bits of the clock counting codes CLKCNT<0:15> to the 16 data transmission lines GIO<0:15>.

The pipe latch 630 may be electrically coupled with the data transmission lines GIO<0:15>. The pipe latch 630 may receive the clock counting codes CLKCNT<0:15> transmitted through the data transmission lines GIO<0:15>. The pipe latch 630 may convert the 16 bits transmitted in parallel through the 16 data transmission lines GIO<0:15>, into 2 serial data, by bundling 8 bits together. The 2 serial data may be respectively outputted through 2 data channels and/or pads DQ0 and DQ1.

The pipe latch 630 may output the clock counting codes CLKCNT<0:15> converted into the serial data, to the data channels and/or pads DQ0 and DQ1, in response to an output control signal RDOUT. The output control signal RDOUT may be generated based on the read signal RD and the test exit signal EXIT. The output control signal RDOUT may be generated through an AND gate 641 and a delay section 642 by being delayed for a preselected time after both the read signal RD and the test exit signal EXIT are enabled. The pipe latch 630 may be a circuit for outputting general data in a normal operation other than the test operation of the semiconductor apparatus, and the test circuit 1 may use the pipe latch 630 used in the normal operation, as it is.

Figure 7:
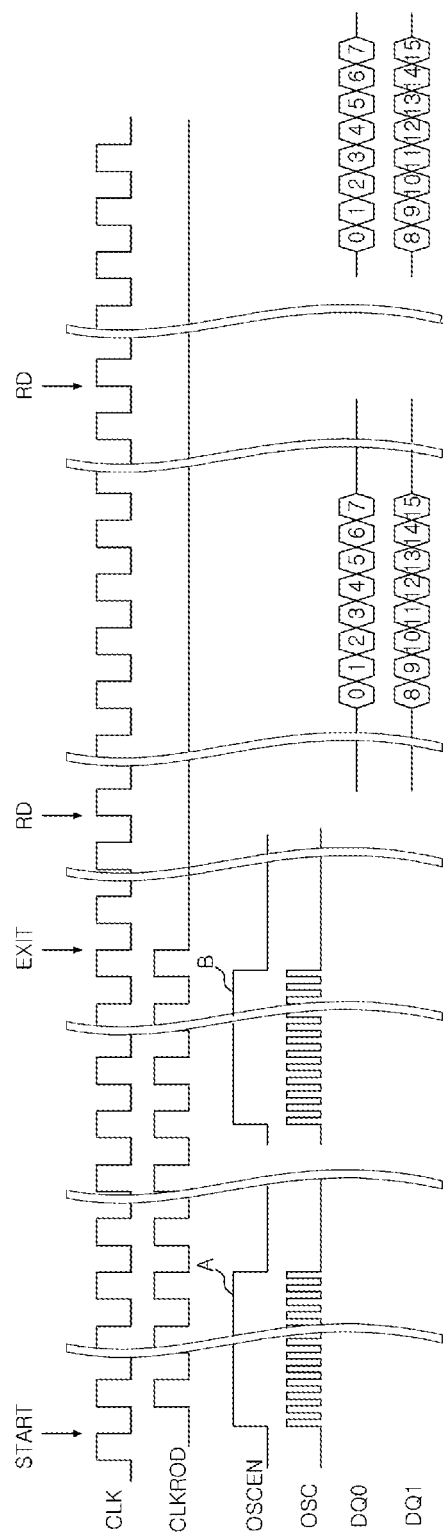
FIG. 7 is a representation of an example of a timing diagram to assist in the explanation of operations of the test circuit of a semiconductor apparatus in accordance with an embodiment.

FIG. 7 is a representation of an example of a timing diagram to assist in the explanation of operations of the test circuit 1 of a semiconductor apparatus in accordance with the embodiments. Operations of the test circuit 1 of a semiconductor apparatus in accordance with the embodiments will be described below with reference to FIGS. 1 to 7. If the test start signal START is enabled, the oscillating enable signal OSCEN is enabled. The ring oscillator 210 generates the period signal OSC in response to the oscillating enable signal OSCEN, and the period signal counter 220 counts the number of times the period signal OSC toggles. The period signal counter 220 may generate the overflow signal OF when the period signal OSC has toggled the predetermined number of times. If the overflow signal OF is enabled, the oscillating enable signal OSCEN may be disabled, and may then be enabled again after the predetermined time passes. That is to say, the oscillating enable signal OSCEN may be periodically enabled based on the overflow signal OF.

The clock signal counting block 120 counts the number of times the internal clock signal CLKROD toggles, for the time during which the period signal OSC toggles the predetermined number of times. The clock signal counting block 120 may generate the clock counting codes CLKCNT<0:15> by counting the number of times the internal clock signal CLKROD toggles.

The update register 130 may store and update the clock counting codes CLKCNT<0:15> each time the overflow signal OF is enabled. The register unit 510 may store the clock counting codes CLKCNT<0:15> generated by the clock signal counting block 120 when a period A during which the oscillating enable signal OSCEN is first enabled ends. The register unit 510 may receive the clock counting codes CLKCNT<0:15> generated by the clock signal counting block 120 when a period B in which the oscillating enable signal OSCEN is second enabled ends.

The minimum value storage unit 520 and the maximum value storage unit 530 compare the logic values of the clock counting codes CLKCNT<0:15> stored in the period A and the clock counting codes CLKCNT<0:15> received in the period B. The minimum value storage unit 520 may update the clock counting codes CLKCNT<0:15> received in the period B as the minimum code values MIN<0:15> in the examples where the logic values of the clock counting codes CLKCNT<0:15> received in the period B are smaller than the logic values of the clock counting codes CLKCNT<0:15> stored in the period A. The minimum value storage unit 520 may retain the clock counting codes CLKCNT<0:15> stored in the period A as the minimum code values MIN<0:15> in the examples where the logic values of the clock counting codes CLKCNT<0:15> received in the period B are larger than the logic values of the clock counting codes CLKCNT<0:15> stored in the period A. Similarly, the maximum value storage unit 530 may update the clock counting codes CLKCNT<0:15> received in the period B as the maximum code values MAX<0:15> in the examples where the logic values of the clock counting codes CLKCNT<0:15> received in the period B are larger than the logic values of the clock counting codes CLKCNT<0:15> stored in the period A. The maximum value storage unit 530 may retain the clock counting codes CLKCNT<0:15> stored in the period A as the maximum code values MAX<0:15> in the examples where the logic values of the clock counting codes CLKCNT<0:15> received in the period B are smaller than the logic values of the clock counting codes CLKCNT<0:15> stored in the period A. While it is illustrated in FIG. 7 that the oscillating enable signal OSCEN is enabled twice, it is to be noted that the oscillating enable signal OSCEN may be periodically enabled a multitude of times based on the overflow signal OF while the test operation is performed and that the minimum value storage unit 520 and the maximum value storage unit 530 may update the clock counting codes CLKCNT<0:15> generated on each of all such occasions as the minimum code values MIN<0:15> and the maximum code values MAX<0:15>.

If the test exit signal EXIT is enabled and a first read signal RD is inputted, the minimum value storage unit 520 may output the minimum code values MIN<0:15> to the multiplexer unit 610, and the maximum value storage unit 530 may output the maximum code values MAX<0:15> to the multiplexer unit 610. The multiplexer unit 610 may output the minimum code values MIN<0:15> to the driver 620 according to the first inputted read signal RD, and the driver 620 may drive and output the respective bits of the minimum code values MIN<0:15> to the data transmission lines GIO<0:15>. The pipe latch 630 may convert the respective bits of the minimum code values MIN<0:15> transmitted through the data transmission lines GIO<0:15>, into serial data, and may output the serial data through the 2 data channels DQ0 and DQ1 in response to the output control signal RDOUT. If a second read signal RD is inputted, the multiplexer unit 610 may output the maximum code values MAX<0:15> to the driver 620 according to the second inputted read signal RD, and the driver 620 may drive and output the respective bits of the maximum code values MAX<0:15> to the data transmission lines GIO<0:15>. The pipe latch 630 may convert the respective bits of the maximum code values MAX<0:15> transmitted through the data transmission lines GIO<0:15>, into serial data, and may output the serial data through the 2 data channels DQ0 and DQ1 in response to the output control signal RDOUT. By checking the data outputted through the data channels DQ0 and DQ1, it may be possible to monitor the general characteristics of the semiconductor apparatus during the test operation.

Figure 8:
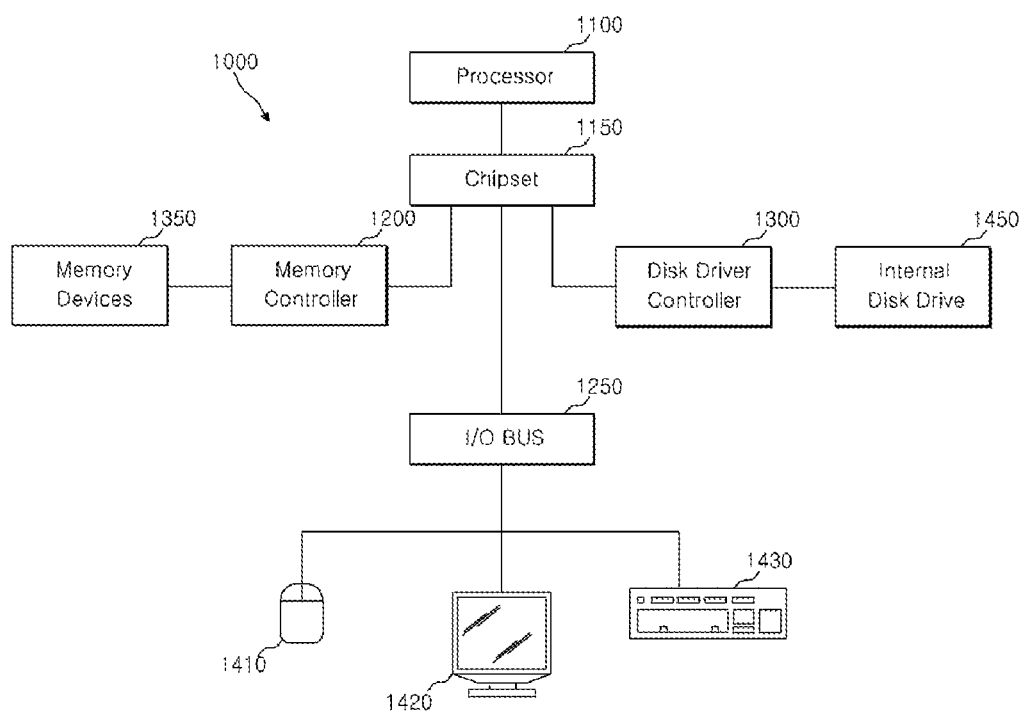
FIG. 8 illustrates a block diagram of an example of a representation of a system employing the semiconductor apparatus and/or method in accordance with the embodiments discussed above with relation to FIGS. 1-7.

The semiconductor apparatus and/or method discussed above (see FIGS. 1-7) are particular useful in the design of memory devices, processors, and computer systems. For example, referring to FIG. 8, a block diagram of a system employing the semiconductor apparatus and/or method in accordance with the embodiments are illustrated and generally designated by a reference numeral 1000. The system 1000 may include one or more processors or central processing units ("CPUs") 1100. The CPU 1100 may be used individually or in combination with other CPUs. While the CPU 1100 will be referred to primarily in the singular, it will be understood by those skilled in the art that a system with any number of physical or logical CPUs may be implemented.

A chipset 1150 may be operably coupled to the CPU 1100. The chipset 1150 is a communication pathway for signals between the CPU 1100 and other components of the system 1000, which may include a memory controller 1200, an input/output ("I/O") bus 1250, and a disk drive controller 1300. Depending on the configuration of the system, any one of a number of different signals may be transmitted through the chipset 1150, and those skilled in the art will appreciate that the routing of the signals throughout the system 1000 can be readily adjusted without changing the underlying nature of the system.

As stated above, the memory controller 1200 may be operably coupled to the chipset 1150. The memory controller 1200 may include at least one semiconductor apparatus and/or employ at least one method as discussed above with reference to FIGS. 1-7. Thus, the memory controller 1200 can receive a request provided from the CPU 1100, through the chipset 1150. In alternate embodiments, the memory controller 1200 may be integrated into the chipset 1150. The memory controller 1200 may be operably coupled to one or more memory devices 1350. In an embodiment, the memory devices 1350 may include the at least one semiconductor apparatus and/or implement at least one method as discussed above with relation to FIGS. 1-7, the memory devices 1350 may include a plurality of word lines and a plurality of bit lines for defining a plurality of memory cells. The memory devices 1350 may be any one of a number of industry standard memory types, including but not limited to, single inline memory modules ("SIMMs") and dual inline memory modules ("DIMMs"). Further, the memory devices 1350 may facilitate the safe removal of the external data storage devices by storing both instructions and data.

The chipset 1150 may also be coupled to the I/O bus 1250. The I/O bus 1250 may serve as a communication pathway for signals from the chipset 1150 to I/O devices 1410, 1420 and 1430. The I/O devices 1410, 1420 and 1430 may include a mouse 1410, a video display 1420, or a keyboard 1430. The I/O bus 1250 may employ any one of a number of communications protocols to communicate with the I/O devices 1410, 1420, and 1430. Further, the I/O bus 1250 may be integrated into the chipset 1150.

The disk drive controller 1450 (i.e., internal disk drive) may also be operably coupled to the chipset 1150. The disk drive controller 1450 may serve as the communication pathway between the chipset 1150 and one or more internal disk drives 1450. The internal disk drive 1450 may facilitate disconnection of the external data storage devices by storing both instructions and data. The disk drive controller 1300 and the internal disk drives 1450 may communicate with each other or with the chipset 1150 using virtually any type of communication protocol, including all of those mentioned above with regard to the I/O bus 1250.

It is important to note that the system 1000 described above in relation to FIG. 8 is merely one example of a system employing the semiconductor apparatuses and/or methods as discussed above with relation to FIGS. 1-7. In alternate embodiments, such as cellular phones or digital cameras, the components may differ from the embodiments illustrated in FIG. 8.

While various embodiments have been described above, it will be understood to those skilled in the art that the embodiments described are by way of example only. Accordingly, the test circuit and the test method of a semiconductor apparatus described herein should not be limited based on the described embodiments.

What is claimed is:

1. A test circuit of a semiconductor apparatus, comprising:
   a period signal counting block configured to count a period signal by a predetermined number of times, and enable an overflow signal;
   a clock signal counting block configured to count an internal clock signal until the overflow signal is enabled, and output clock counting codes; and
   an update register configured to receive and store the clock counting codes based on the overflow signal.

2. The test circuit according to claim 1, wherein the period signal counting block performs an operation of counting the period signal based on a test start signal, and interrupts the operation of counting the period signal based on a test exit signal.

3. The test circuit according to claim 1, wherein the period signal counting block repeatedly performs an operation of counting the period signal by the predetermined number of times, every time the overflow signal is enabled.

4. The test circuit according to claim 1, wherein the period signal counting block comprises:
   a ring oscillator configured to generate the period signal in response to an oscillating enable signal;
   a period signal counter configured to count the period signal, and generate period signal counting codes; and
   a counting control unit configured to generate the overflow signal when the period signal counting codes have specific logic values, and block the period signal from being provided to the period signal counter when the overflow signal is enabled,
   wherein the period signal oscillates to a level of a power supply voltage.

5. The test circuit according to claim 4,
   wherein the period signal counter is reset in response to a counting reset signal,
   wherein the counting reset signal is generated based on the overflow signal.

6. The test circuit according to claim 5, wherein the counting control unit outputs the period signal to the period signal counter in response to the counting reset signal.

7. The test circuit according to claim 1, wherein the update register comprises:
   a register unit configured to store the clock counting codes based on the overflow signal;
   a minimum value storage unit configured to compare clock counting codes previously received and clock counting codes currently outputted from the register unit, and store clock counting codes with smaller logic values as minimum code values; and
   a maximum value storage unit configured to compare clock counting codes previously received and clock counting codes currently outputted from the register unit, and store clock counting codes with larger logic values as maximum code values.

8. The test circuit according to claim 7, wherein the minimum value storage unit and the maximum value storage unit perform operations of comparing code values, and output code values stored therein, in response to a read signal.

9. The test circuit according to claim 7, further comprising:
an output block configured to output the minimum code values and the maximum code values outputted from the update register, as data, in response to the read signal.

10. The test circuit according to claim 9, wherein the output block comprises:
a multiplexer unit configured to output either minimum code values or the maximum code values in response to the read signal;
drivers configured to output an output of the multiplexer unit to data transmission lines; and
a pipe latch configured to align signals transmitted through the data transmission lines, in response to an output control signal, and output the aligned signal as the data.

11. The test circuit according to claim 10, wherein the multiplexer unit outputs either the minimum code values or the maximum code values in response to the read signal inputted first, and outputs the other code values, not outputted in response to the read signal inputted first, in response to the read signal inputted second.

12. The test circuit according to claim 10, wherein the read signal comprises a minimum value read signal and a maximum value read signal, and
wherein the multiplexer unit outputs the minimum code values in response to the minimum value read signal and outputs the maximum code values in response to the maximum value read signal.

13. A test method of a semiconductor apparatus, comprising:
toggling a period signal by a predetermined number of times in each predetermined period when a test operation is started;
counting an internal clock signal for a time during which the period signal is toggled by the predetermined number of times, and generating clock counting codes;
updating the clock counting codes in each predetermined period; and
outputting updated clock counting codes when the test operation is ended.

14. The test method according to claim 13, wherein the toggling comprises:
enabling an oscillating enable signal based on an overflow signal in each predetermined period; and
enabling the overflow signal when the period signal is counted by the predetermined number of times.

15. The test method according to claim 14, wherein the generating of the clock counting codes is repeatedly performed based on the overflow signal.

16. The test method according to claim 13, wherein the updating comprises comparing clock counting codes previously stored and clock counting codes currently inputted, storing clock counting codes with smaller logic values as minimum code values, and storing clock counting codes with larger logic values as maximum code values.

17. The test method according to claim 13, wherein the outputting comprises:
outputting the updated clock counting codes to data transmission lines in response to a read signal; and
aligning signals transmitted through the data transmission lines, and outputting the aligned signals as data.

18. A test circuit of a semiconductor apparatus, comprising:
a period signal counting block configured to count a period signal within a predetermined period and generate an overflow signal;
a clock signal counting block configured to count an internal clock signal based on the overflow signal, and output clock counting codes for each predetermined period; and
an update register configured to receive and store the clock counting codes.

19. The test circuit according to claim 18,
wherein the period signal counting block is configured to count the period signal by a predetermined number of times within each of the predetermined periods, and
wherein the overflow signal is generated each time the period signal is counted by the predetermined number of times.

20. The test circuit according to claim 19, wherein the count of the internal clock signal is reset by the clock signal counting block in response to the overflow signal.

* * * * *